United States Patent
Dungan et al.

(10) Patent No.: US 7,755,123 B2
(45) Date of Patent: Jul. 13, 2010

(54) APPARATUS, SYSTEM, AND METHOD PROVIDING BACKSIDE ILLUMINATED IMAGING DEVICE

(75) Inventors: Thomas E. Dungan, Fort Collins, CO (US); Chintamani Palsule, Fort Collins, CO (US)

(73) Assignee: Aptina Imaging Corporation, Grand Cayman (KY)

( * ) Notice: Subject to any disclaimer, the term of this patent is extended or adjusted under 35 U.S.C. 154(b) by 79 days.

(21) Appl. No.: 11/892,640

(22) Filed: Aug. 24, 2007

(65) Prior Publication Data

US 2009/0050947 A1 Feb. 26, 2009

(51) Int. Cl.
*H01L 31/062* (2006.01)

(52) U.S. Cl. .................. 257/294; 257/432; 257/436; 257/440; 257/E27.134; 257/E31.127

(58) Field of Classification Search ............ 257/294, 257/432, 436, 440, E27.134, E31.127
See application file for complete search history.

(56) References Cited

U.S. PATENT DOCUMENTS

| | | | |
|---|---|---|---|
| 4,507,674 A | 3/1985 | Gaalema | |
| 4,645,562 A * | 2/1987 | Liao et al. | 438/640 |
| 5,122,669 A | 6/1992 | Herring et al. | |
| 5,227,313 A | 7/1993 | Gluck et al. | |
| 5,244,817 A | 9/1993 | Hawkins et al. | |
| 5,808,350 A * | 9/1998 | Jack et al. | 257/440 |
| 6,169,319 B1 | 1/2001 | Malinovich et al. | |
| 6,319,820 B1 * | 11/2001 | Liu | 438/633 |
| 6,498,336 B1 | 12/2002 | Tian et al. | |
| 6,593,607 B1 | 7/2003 | Hseih | |
| 6,657,272 B2 | 12/2003 | He et al. | |
| 6,670,600 B2 | 12/2003 | Terano et al. | |
| 7,057,254 B2 | 6/2006 | Bui et al. | |
| 7,142,501 B1 | 11/2006 | Barrass et al. | |
| 7,160,753 B2 | 1/2007 | Williams, Jr. | |
| 7,259,788 B1 | 8/2007 | Olding et al. | |
| 2001/0026001 A1 | 10/2001 | Yagi | |
| 2004/0155198 A1 * | 8/2004 | Miyata et al. | 250/370.11 |
| 2005/0255625 A1 | 11/2005 | Janesick et al. | |
| 2006/0152931 A1 | 7/2006 | Holman | |

(Continued)

FOREIGN PATENT DOCUMENTS

EP    1 916 714 A1    4/2008

(Continued)

OTHER PUBLICATIONS

High Sensitivity and No-Crosstalk Pixel Technology for Embedded CMOS Image Sensor, Furumiya et al., IEEE Transactions on Electron Devices, vol. 48, No. 10, Oct. 2001, pp. 2221-1219.

(Continued)

*Primary Examiner*—Tu-Tu V Ho
(74) *Attorney, Agent, or Firm*—Dickstein Shapiro LLP (57) ABSTRACT

Method, apparatus, and/or system providing a backside illuminated imaging device. A non-planar metallic or otherwise reflective layer is provided in an image pixel cell at the frontside of the device substrate to capture radiation passing through the device substrate. The non-planar surface is formed to be capable of reflecting substantially all such radiation back to a photosensor located in the same pixel cell.

20 Claims, 9 Drawing Sheets

U.S. PATENT DOCUMENTS

| | | |
|---|---|---|
| 2007/0001100 A1 | 1/2007 | Hsu et al. |
| 2007/0045513 A1 | 3/2007 | Lee et al. |
| 2007/0052050 A1 | 3/2007 | Dierickx |
| 2007/0117254 A1* | 5/2007 | Pain .......................... 438/75 |

FOREIGN PATENT DOCUMENTS

| | | |
|---|---|---|
| GB | 2 420 224 A | 5/2006 |
| JP | 2006-261372 | 9/2006 |
| WO | WO 2000/007411 | 2/2000 |
| WO | WO 2005/122262 A1 | 12/2005 |
| WO | WO 2006/089447 | 8/2006 |

OTHER PUBLICATIONS

Device Technologies for High Quality and Smaller Pixel in CCD and CMOS Image Sensors, H. Abe, Semiconductor Solutions Network Company, Sony Corp. (2004).

High Density Land/Groove Recording, Iwanaga et al., IEEE Transactions on Magnetics, vol. 31, No. 6, Nov. 1995, pp. 3221-3226.

A Simple Approach to Modeling Cross-Talk Integrated Circuits, IEEE Journal of Solid State Circuits, vol. 29, No. 10, Oct. 1994, pp. 1212-1219.

\* cited by examiner

FIG. 6

APPARATUS, SYSTEM, AND METHOD PROVIDING BACKSIDE ILLUMINATED IMAGING DEVICE

FIELD OF THE INVENTION

Embodiments of the invention relate generally to an apparatus, system, and method providing a backside illuminated imaging device.

BACKGROUND OF THE INVENTION

Solid state imaging devices, also known as imagers, have been used in various photo-imaging applications, including cameras, camera mobile telephones, video telephones, computer input devices, scanners, machine vision systems, vehicle navigation systems, surveillance systems, auto focus systems, star trackers, motion detector systems, and image stabilization systems among other applications.

There are a number of different types of semiconductor-based imaging devices, including charge coupled devices (CCDs), photodiode arrays, charge injection devices (CIDs), hybrid focal plane arrays, complementary metal oxide semiconductor (CMOS) imaging devices, and other imaging devices. When used with appropriate imaging circuits, imaging devices can capture, process, store, and display images for various purposes.

Imaging devices are typically formed with an array of pixels each containing a photosensor, such as a photogate, phototransistor, photoconductor, or photodiode. The photosensor in each pixel absorbs incident radiation of a particular wavelength (e.g., optical photons or x-rays) and produces an electrical signal corresponding to the intensity of light impinging on that pixel when an optical image is focused on the pixel array. For example, the magnitude of the electrical signal produced by each pixel can be proportional to the amount of incident light captured. The electrical signals from all the pixels are then processed to provide information about the captured optical image for storage, printing, display, or other usage.

Imaging devices can be constructed so that incident light impinges on the frontside or alternatively the backside of the imaging devices. For example, a backside illuminated imaging device receives incident radiation through a backside of the device substrate, over which the imaging device circuitry is formed. In a backside illuminated imaging device, the device substrate is typically thinned so that the photosensors can more easily detect light received from the backside of the imaging device, thereby reducing electronic and/or optical crosstalk. When a backside illuminated imaging device is used to detect incident light having different wavelength components, such as in the case of a color imaging device, the thinned device substrate may not provide sufficient depth for radiation components of longer wavelengths (e.g., red light). Consequently, such longer wavelength radiation components may penetrate through the device substrate without being detected by the corresponding photosensors, thereby compromising quantum efficiency of the imaging device and causing other problems such as crosstalk.

Accordingly, it is desirable to provide an improved structure for a backside illuminated image pixel cell, image pixel array, imaging device, and/or system that reduces the effects of the above discussed deficiencies. It is also desirable to provide a method of fabricating an image pixel cell, image pixel array, imaging device, and/or system exhibiting these improvements.

DETAILED DESCRIPTION OF THE INVENTION

In the following detailed description, reference is made to the accompanying drawings, which form a part hereof and show by way of illustration specific embodiments and examples in which the invention may be practiced. These embodiments and examples are described in sufficient detail to enable one skilled in the art to practice them. It is to be understood that other embodiments and examples may be utilized, and that structural, logical, and electrical changes and variations may be made. Moreover, the progression of processing steps is described as an example; the sequence of steps is not limited to that set forth herein and may be changed, with the exception of steps necessarily occurring in a certain order.

The term "substrate" used herein may be any supporting structure including, but not limited to, a semiconductor substrate having a surface on which devices can be fabricated. A semiconductor substrate should be understood to include silicon, silicon-on-insulator (SOI), silicon-on-sapphire (SOS), doped and undoped semiconductors, epitaxial layers of silicon supported by a base semiconductor foundation, and other semiconductor structures, including those made of semiconductors other than silicon. When reference is made to a semiconductor substrate in the following description, previous process steps may have been utilized to form regions or junctions in or over the base semiconductor or foundation.

The term "pixel" or "pixel cell" as used herein, refers to a photo-element unit cell containing a photosensor for converting photons to an electrical signal as may be employed by an imaging device. The pixel cells described herein in the embodiments can be CMOS four-transistor (4-T) pixel cells, or pixel cells that have more or less than four transistors. In addition, the embodiments disclosed herein may be employed in other types of solid state imaging devices other than CMOS imaging devices, e.g., CCD and others, where a different pixel and readout architecture may be used.

Various embodiments are now described with reference to the drawing figures, in which similar components and elements are designated with the same reference numeral and redundant description is omitted. Although the embodiments are described in relation to use with a CMOS imaging device, as noted, the embodiments are not so limited and have applicability to other solid state imaging devices.

Figure 1A:
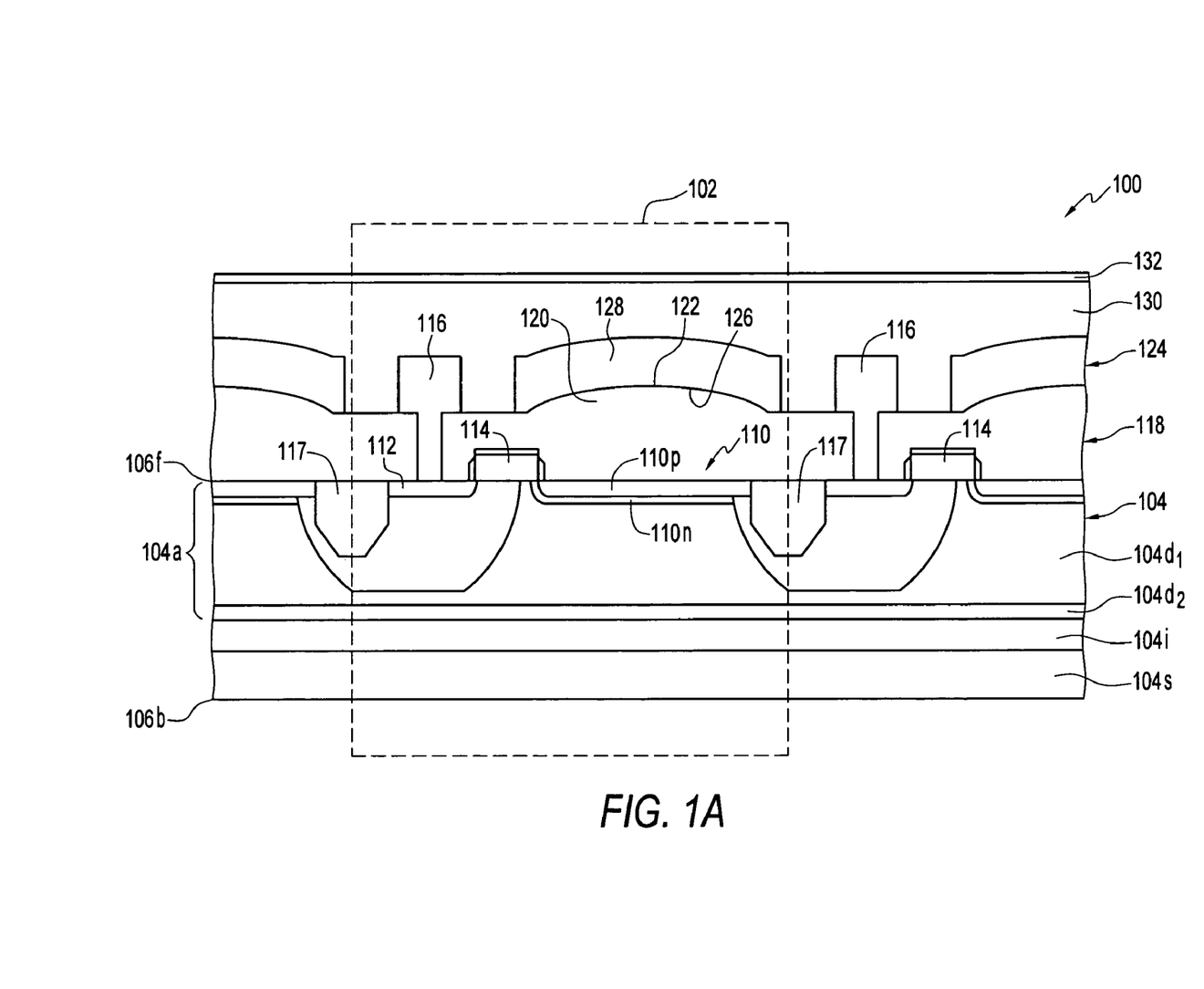
FIG. 1A illustrates a partial cross-sectional view of an image pixel array formed in accordance with a first embodiment disclosed herein.
Figure 1B:
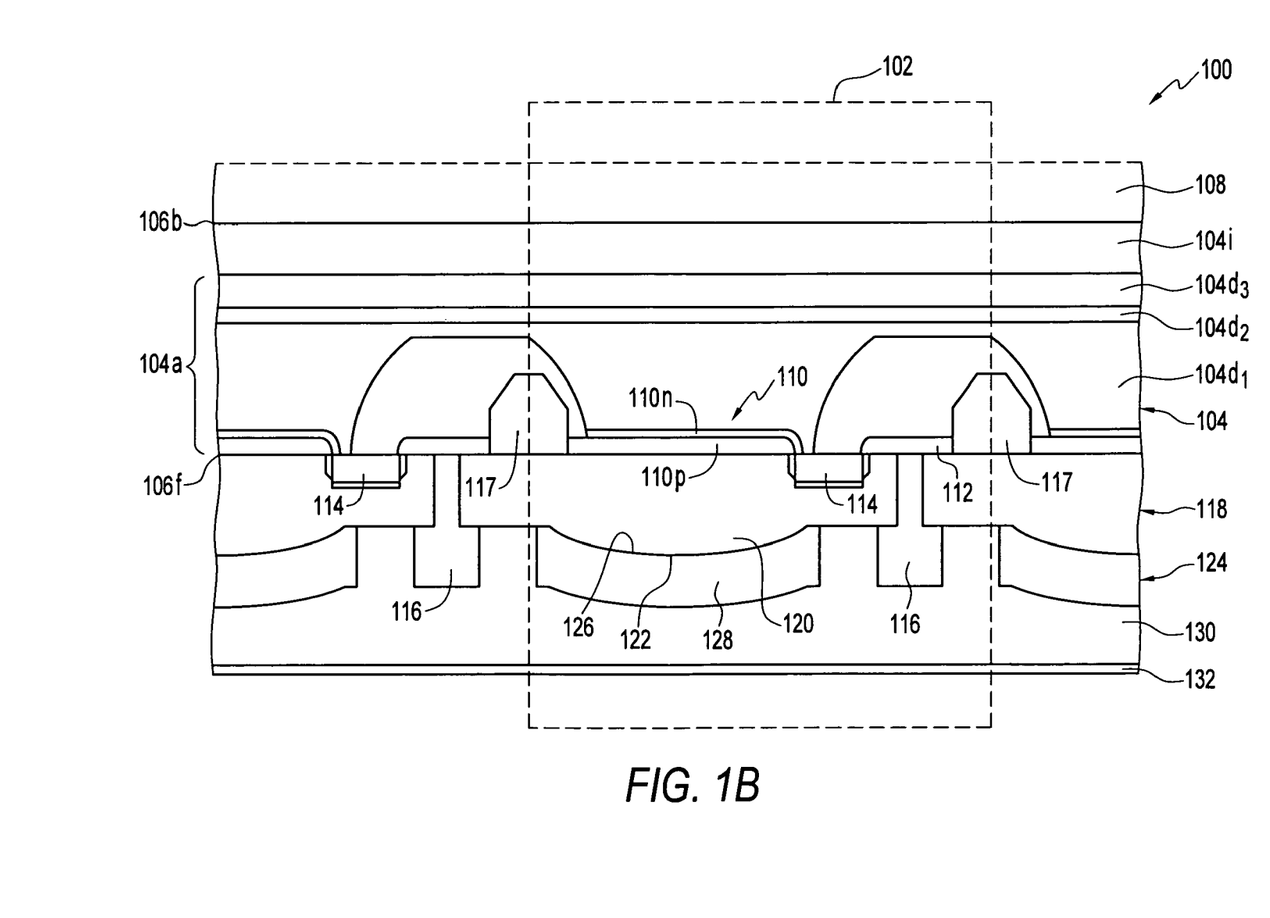
FIG. 1B illustrates a partial cross-sectional view of an image pixel array similar to the FIG. 1A structure, which is flipped over in FIG. 1B.
Figure 1C:
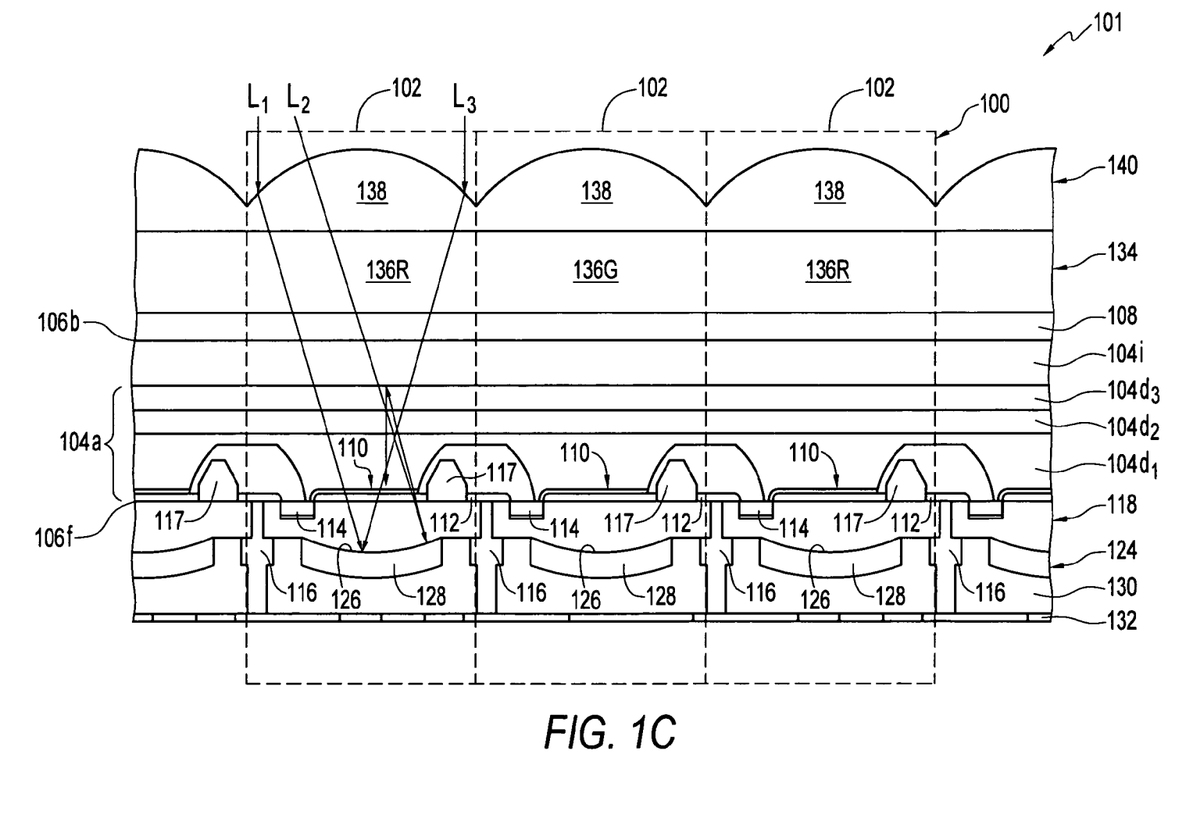
FIG. 1C illustrates a partial cross-sectional view of a backside illuminated imaging device containing an image pixel array similar to that shown in FIG. 1B.

FIGS. 1A to 1C illustrate an image pixel array 100 formed in accordance with a first embodiment and an imaging device 101 containing the image pixel array 100. The image pixel array 100 contains a plurality of image pixel cells 102, which can be similarly formed. Accordingly, only one image pixel cell 102 and its associated semiconductor components will be described below for the sake of simplicity.

The image pixel array 100 can be formed over a semiconductor device substrate 104 defined by a frontside 106f and a backside 106b. The device substrate 104 can be formed as a single-portion structure (not shown) or a combination of different portions including portions $104d_1$, $104d_2$, $104d_3$ (FIGS. 1B and 1C). For example, the different portions $104d_1$, $104d_2$, $104d_3$ can be differently doped portions with different conductivities and implantation concentrations. The portion $104d_1$ of the device substrate 104 can be less doped than portions $104d_2$, $104d_3$ or substantially undoped. In the following description, the portion $104d_1$ is also referred to as a lightly doped portion for simplicity but is not so limited. The various portions $104d_1$, $104d_2$, $104d_3$ can have increasing conductivities and implantation concentrations from the frontside 106f toward the backside 106b of the device substrate 104. In a semiconductor device with a p-type substrate, the doped portions $104d_2$, $104d_3$ can be respectively $p^-$ and $p^+$ doped areas.

In the various examples shown in FIGS. 1A to 1C, the device substrate 104 can have a silicon-on-insulator (SOI) structure including an insulator 104i, such as silicon dioxide. In the example shown in FIG. 1A, the silicon-on-insulator substrate 104 can be formed with a lightly doped portion $104d_1$ and a doped portion $104d_2$ on one side of the insulator 104i, and another doped or undoped portion 104s on the opposite side of the insulator 104i. As is described in the various examples below, the portion 104s can be removed from the device substrate 104 before forming the additional semiconductor components of the backside optics. Those skilled in the art will appreciate that the device substrate 104, including the different portions $104d_1$, $104d_2$, $104d_3$, 104i, 104s, can be in various other forms.

The device substrate 104 formed can have an active silicon portion 104a. In the examples shown in FIGS. 1A to 1C, the active silicon portion 104a can include the various portions formed between the frontside 106f and the insulator 104i. For example, the active silicon portion 104a in FIG. 1A can include the lightly doped portion $104d_1$ and the doped portion $104d_2$. In the examples shown in FIGS. 1B and 1C, the active silicon portion 104a can include the lightly doped portion $104d_1$ and the doped portions $104d_2$, $104d_3$. The thickness of the active silicon portion 104a can be adjusted to a predetermined value by any of various techniques, such as etching, end-of-range proton implantation shearing, epitaxy, or a combination of the above. For example, the thickness of the active silicon portion 104a can be in the range from about 0.5 µm to about 20 µm.

The device substrate 104 can be formed by any of various methods, including but not limited to oxygen implantation, wafer bonding and etchback, epitaxial lift-off. In the above described example where the device substrate 104 is formed into a silicon-on-insulator structure, the device substrate 104 can be formed by an end-of-range proton implantation shearing, which is also known as the SMART CUT™ technique developed at the CEA-LETI research institute. Those skilled in the art will appreciate that the device substrate 104, including the different portions $104d_1$, $104d_2$, $104d_3$, 104i, 104s can be formed by various other methods.

As FIG. 1A shows, a photosensor 110 can be formed in association with the device substrate 104, such as in the lightly doped portion 104d, near the frontside 106f of the device substrate 104. The photosensor 110 can be in any of various forms, such as a photogate, phototransistor, photoconductor, or photodiode. In one example, the photosensor 110 can be a photosensitive region formed in the active silicon portion 104a. The photosensitive region of the photosensor 110 can include an n-type doped region 110n connected to an adjacent channel of the transfer gate 114, as is shown in FIG. 1A. The n-type doped region 110n can be separated from the frontside 106f of the device substrate 104 by a p-type doped region 100p, e.g., a $p^+$ implantation region. Those skilled in the art will appreciate that the photosensor 110 can be in various other forms.

In one embodiment, the photosensor 110 can be formed to receive and convert visible radiation, such as radiation having a wavelength in the range from about 400 nm to about 740 nm, into electronic signals. For a color imaging device, the photosensor 110 can be formed to receive one of red, green, and blue light passing through an appropriate color filter. The various photosensors 110 of a pixel array 100 can be arranged in any of various mosaic patterns, such as a Bayer pattern. For a monochromatic imaging device, all photosensors 110 of a pixel array 100 are open to the same incident wavelengths, through no filter or the same filter.

Additional semiconductor structures and components, including a floating diffusion region 112 and a transfer gate 114, such as those used in 4-T CMOS imaging pixels, can also be provided in association with the device substrate 104. In one example, the floating diffusion region 112 and the transfer gate 114 can be formed over the substrate 104 at the frontside 106f. A metallic connector 116 can be provided to interconnect the various metallic circuitry layers and/or semiconductor components of the pixel cell 102. For example, the metallic connector 116 can be employed to connect the floating diffusion region 112 to a gate of a source follower transistor commonly used in a 4-T CMOS pixel. A pixel isolation region 117 can be provided to separate adjacent pixel cells 102 from each other. Those skilled in the art will appreciate that the floating diffusion region 112, transfer gate 114, metallic connector 116, and pixel isolation regions 117 can be formed by any of various other methods.

Each pixel cell 102 can be formed to include a dielectric layer 118 provided over the device substrate 104 at its frontside 106f. The dielectric layer 118 can be formed to have at least one protruding portion 120. As is shown in FIG. 1A, the dielectric layer 118 can be formed to comprise a plurality of protruding portions 120 each being aligned with a corresponding photosensor 110 in the same pixel cell 102. Each protruding portion 120 can have a convex surface 122 formed facing away from the device substrate 104. In the example shown in FIG. 1A, the convex surface 122 has a curved shape. Other shapes of the surface 122 may also be used and are described below. The protruding portions 120 of the dielectric layer 118 can be formed by any of various methods as is described below to assist in defining the contour of a metallic portion 124.

A metallic portion 124 can be formed to direct photons reaching the metallic layer 124 to the photosensors 110 so as to be captured thereby. In one example, the metallic portion 124 is in the form of a layer. As FIG. 1A shows, the metallic layer 124 can have at least one non-planar surface 126 facing toward the corresponding photosensor 110 formed in the same pixel cell 102. The non-planar surface 126 can be formed to expand laterally beyond the corresponding photosensitive region of the photosensor 110. In the example of FIG. 1C, the metallic layer 124 can be formed to have a plurality of radiation reflectors 128 each having a non-planar surface 126. The non-planar surface 126 of each radiation reflector 128 can comprise a concave surface, which can further focus the reflected radiation toward the photosensor 110 in the same pixel cell 102. In the example shown in FIG. 1A, the non-planar surface 126 has a curved concave shape. Each non-planar surface 126 is capable of directing incident radiation reaching the non-planar surface 126 toward the photosensor 110 in the same pixel cell 102, thereby not only improving quantum efficiency, but also reducing crosstalk, such as the crosstalk caused by off-axis radiation.

In one example, the metallic layer 124 can be formed over the dielectric layer 118 conforming to the convex surfaces 122 on the protruding portions 120. The convex surfaces 122 of the dielectric layer 118 each define the contour of a non-planar surface 126 of the metallic layer 124, which is substantially complementary to the convex surface 122. The metallic layer 124 can be formed of any materials similar to those used for forming circuitry layers in conventional semiconductor devices. In one example, the metallic layer 124 can comprise an aluminum material. The metallic layer 124 can be in any of various forms, such as a metal coating. Those skilled in the art will appreciate that various other materials and methods can also be used to form the metallic layer 124.

As FIG. 1A shows, additional inter-metal dielectric and interconnecting metal portions, such as a readout circuit as will be described below, can be provided for the image pixel array 100. For example, the metallic layer 124 can be further pattern etched to form the metal connectors 116 connecting to the floating diffusion regions 112. A plurality of conventional portions, illustrated as an inter-metal dielectric 130 and a metallization layer 132 in FIG. 1A, can be provided and formed over the metallic layer 124. Although FIG. 1A shows one metallization layer 132, one or more additional metallization layers 132 can employed which contain associated metallization patterns for interconnecting components of a pixel cell 102. Additionally or alternatively, the metallization patterns in the one or more metallization layers 132 can be formed to connect a pixel cell 102 to other interconnecting metal portions of an imaging device 101 (see, FIG. 1C). Those skilled in the art will appreciate that the additional inter-metal dielectric and interconnecting metal portions can be formed by any of various methods.

The metallic layer 124 can be connected to one or more metallization layers 132 by any of various methods such as those used to connect metallization layers 132. For example, the metallic layer 124 can be connected to an adjacent metallization layer 132 by way of the metal connectors 116 as is shown in FIG. 1C. In one example, the metallic layer 124 can be formed to contain at least some of the associated metallization patterns. In such a case, the metallic layer 124 can be used as a metallization layer 132. For example, the metallic layer 124 can be formed as the first level metallization layer 132, which is located the closest to the device substrate 104 at its frontside 106f. In another example, the metallic layer 124 can be formed as a separate layer without the associated metallization patterns.

FIG. 1B shows the FIG. 1A structure being flipped over, which can be attached to a support (not shown) for further processes of additional semiconductor components to form the backside optics as described below. The portion 104s shown in FIG. 1A can be removed to expose the insulator 104i, such as a dielectric, at the backside 106b of the backside illuminated imaging device 101. For example, the portion 104s can be removed by any of various methods, such as cutting, grinding, etching, or a combination thereof.

Optionally, a passivation portion 108 can be provided over the insulator 104i as is shown in FIG. 1B, after the portion 104s is removed. The passivation portion 108 can be formed of any of various materials, including but not limited to, one or more of phospho-silicate-glass (PSG), silicon nitride, or silicon oxynitride. In one example, the passivation portion 108 is formed of a silicon nitride material. The passivation portion 108 can also be a part of the insulator 104i or otherwise integrally formed therewith.

FIG. 1C shows additional semiconductor components formed in the image pixel array 100 and/or an imaging device 101 containing the image pixel array 100. At the backside 106b of the device substrate 104, a color filter array 134 can be formed over the insulator 104i and/or the passivation portion 108 for capturing different color components in incident radiation. The color filter array 134 is formed of a plurality of color filters 136R, 136G, each of which is provided within a pixel cell 102 and positioned over a corresponding photosensor 110 and below a corresponding microlens 138. FIG. 1C shows one row of a color filter array 134, where the first color filters 136R alternate with the second color filters 136G. For example, color filters 136R and 136G can be respectively red and green filters. Additional color filters, such as blue filters (not shown), can also be employed in the color filter array 134 and be arranged to alternate with green filters (e.g., color filter 136G) in an adjacent row of pixel cells 102 in a pixel array 100. In another example, the color filters 136R, 136G can be cyan, magenta, and yellow filters.

As those skilled in the art will appreciate, each of the color filters 136R, 136G and additional color filters in another row can be formed to be sensitive to specific wavelengths (band), allowing light of those wavelengths (band) to pass through and reach the corresponding photosensor 110 for a color imaging device. For a monochromatic imaging device, the color filters 136R, 136G can be disposed with, or all provided filters can be formed to pass the same wavelengths of light. For a color imaging device, the color filter array 134 can have red, green, and blue filters, which can be arranged in a predetermined mosaic sequential pattern, such as a Bayer pattern. Those skilled in the art will appreciate that filters of other colors or patterns may also be used to capture color images.

A microlens array 140 can be provided and formed over the color filter array 134 by any of various known methods. As those skilled in the art will appreciate, the microlenses 138 in the microlens array 140 can effectively focus incident radiation on the photosensors 110 and hence reduce crosstalk in the imaging device 101.

FIG. 1C shows the optical path of incident light having different angles after such incident light enters the imaging device 101. For example, incident lights $L_1$, $L_2$, and $L_3$ from an image impinge on the microlens 138 in a pixel cell 102. Due to the thinned thickness of the device substrate 104 at the backside, a portion of the radiation components in incident lights $L_1$, $L_2$, and $L_3$ may penetrate the device substrate 104 or otherwise escape the photosensor 110 located in the same pixel cell 102. The penetrated radiation components of incidents light $L_1$, $L_2$, and $L_3$ will reach the curved concave surface 126 of the radiation reflector 128 as shown in FIG. 1C. For example, incident lights $L_1$ and $L_3$ can be on-axis incident light so that the penetrated radiation components of incidents light $L_1$ and $L_3$ will reach the middle portion of the non-planar surface 126. Such penetrated radiation components of incident lights $L_1$ and $L_3$ can be reflected by the non-planar surface 126 of the radiation reflector 128 back to the photosensor 110 to be captured thereby.

As FIG. 1C also shows, incident light $L_2$ represents off-angle light. The penetrated radiation components of incident light $L_2$, when reaching the radiation reflector 128, will be away from the middle portion and toward the edge portion of the non-planar surface 126. The non-planar surface 126, which is in the shape of a curved concave surface, can reflect the penetrated radiation components of incident light $L_2$ back to the photosensor 110 in the same image pixel cell 102. Accordingly, the reflected radiation components of incident light $L_2$ will not enter an adjacent pixel cell 102, which thereby reduces optical crosstalk.

Next, an embodiment of making the image pixel array 100 and/or the image pixel cell 102 is described in connection with FIGS. 2A to 2F.

Figure 2A:
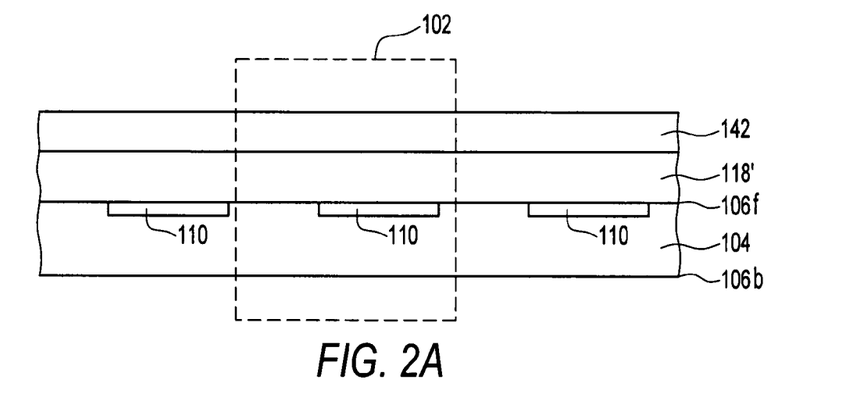
FIGS. 2A to 2F illustrate an embodiment of making the image pixel array shown in FIG. 1A.

FIG. 2A shows that a device substrate 104 is provided and defined by a frontside 106f and a backside 106b. In each pixel cell 102, a photosensor 110 can be provided in the device substrate 104 and formed near the frontside 106f. Additional semiconductor components, such as the floating diffusion region 112, transfer gate 114, pixel isolation regions 117 shown in FIG. 1A, can also be formed in association with the device substrate 104, but are not depicted in FIG. 2A for simplicity.

As is shown in FIG. 2A, a dielectric material 118' is formed over the device substrate 104 at its frontside 106f by any of various methods, such as plasma-enhanced chemical vapor deposition. The dielectric material 118' can be shaped by any of various techniques to form the dielectric layer 118 containing a plurality of protruding portions 120 (see FIG. 2D).

Figure 2B:
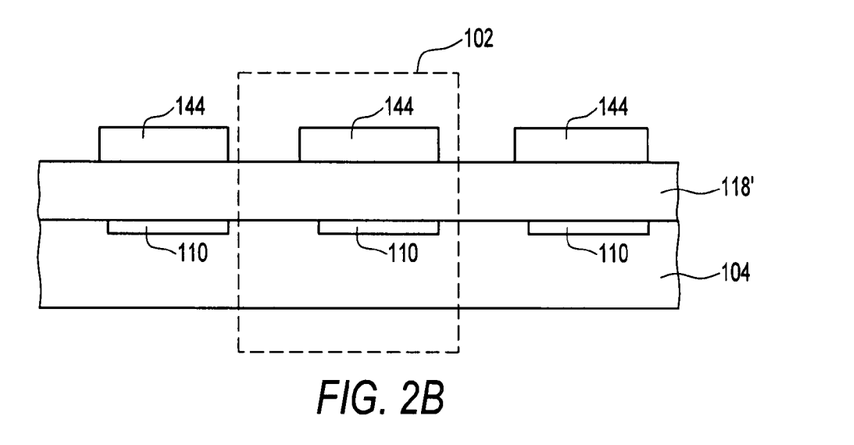

In one example, a photoresist material 142 is formed over the dielectric material 118' by any of various methods. The photoresist material 142 can be subjected to masked-exposing and developing to obtain a plurality of photoresist precursors 144 as shown in FIG. 2B. Each of the photoresist precursors 144 is formed to be aligned with a photosensor 110 in the same pixel cell 102.

Figure 2C:
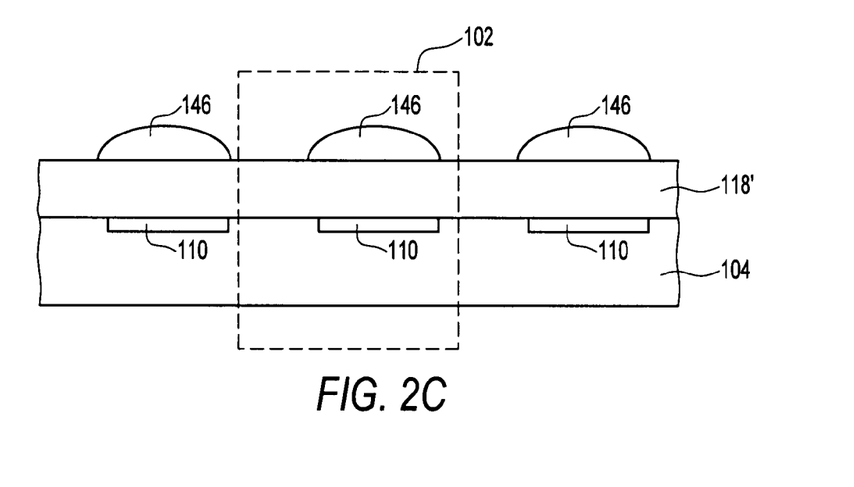

The photoresist precursors 144 can be formed into contoured precursors 146 as shown in FIG. 2C. For example, the contoured precursors 146 can have a curved surface. A reflow process can be employed for such a purpose. The contoured precursors 146 can be formed to have a similar shape as that of the protruding portions 120 shown in FIG. 2D. Although the contoured precursors 146 are shown to have a curved shape, those skilled in the art will appreciate that various other shapes, including those shown in FIGS. 3 and 4, can also be employed to form the contoured precursors 146.

Figure 2D:
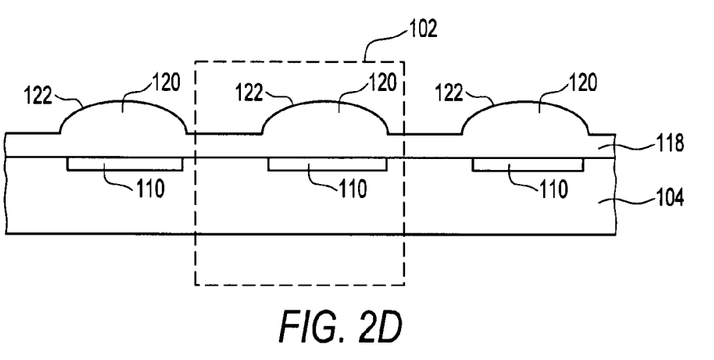

FIG. 2D shows that the shape of the curved photoresist precursors 146 is transferred into the underlying dielectric material 118' to form the protruding portions 120. For example, an etching process can be used to remove the shaped photoresist precursors 146 and selectively remove the dielectric material 118' to form the dielectric layer 118. In one example, the photoresist material and the dielectric material can have substantially the same selectivity such that they can be removed at substantially the same rate during an the etching process. The etching process can also remove the portions of the dielectric material 118' between two adjacent protruding portions 120. In one example, a plasma etching process can be employed to form a curved convex surface 122 of each protruding portion 120. As FIG. 2D shows, the resulting dielectric layer 118 can contain a plurality of protruding portions 120, each being aligned with a photosensor 110 in the same pixel cell 102. Those skilled in the art will appreciate that various other methods can be used to form the protruding portions 120.

Figure 3:
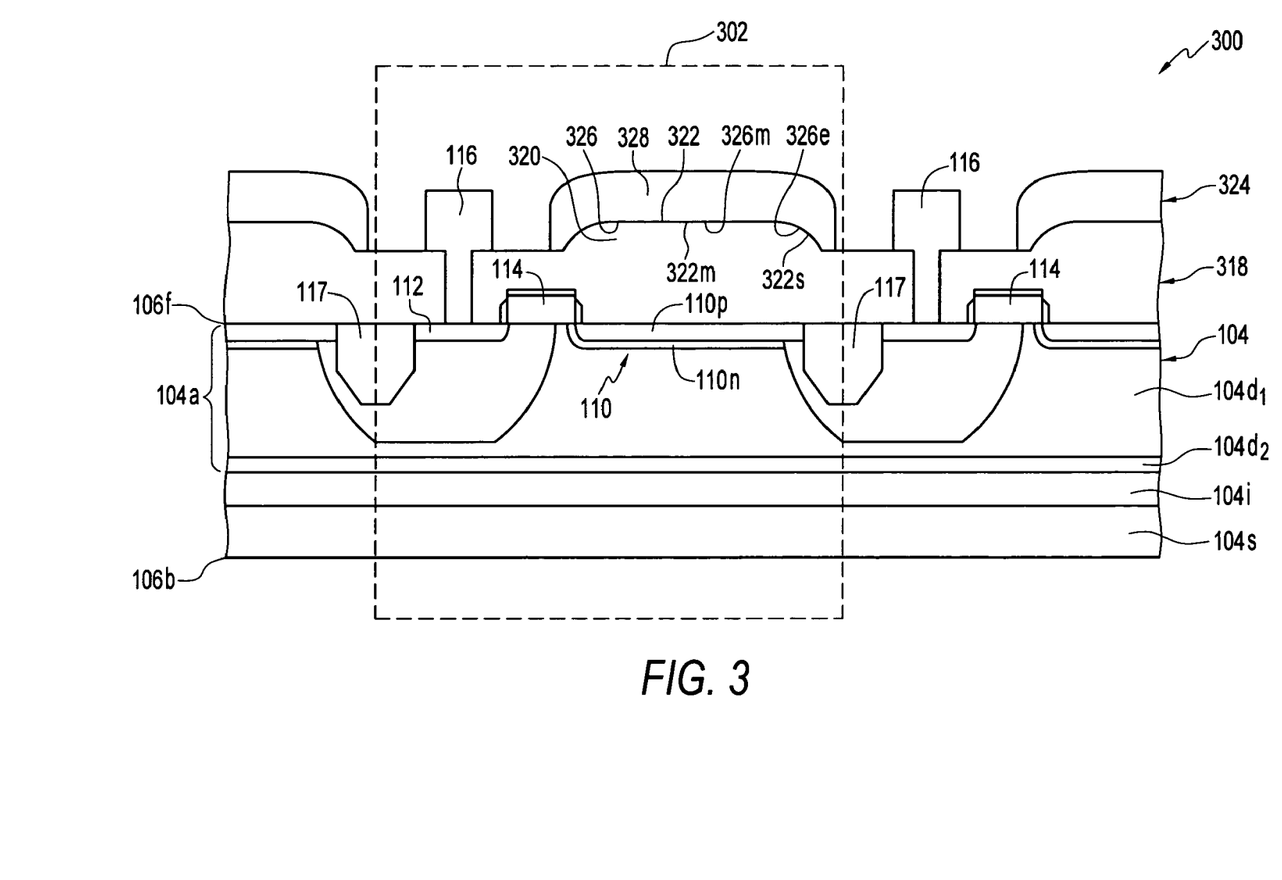
FIG. 3 illustrates a partial cross-sectional view of an image pixel array formed in accordance with a second embodiment disclosed herein.
Figure 4:
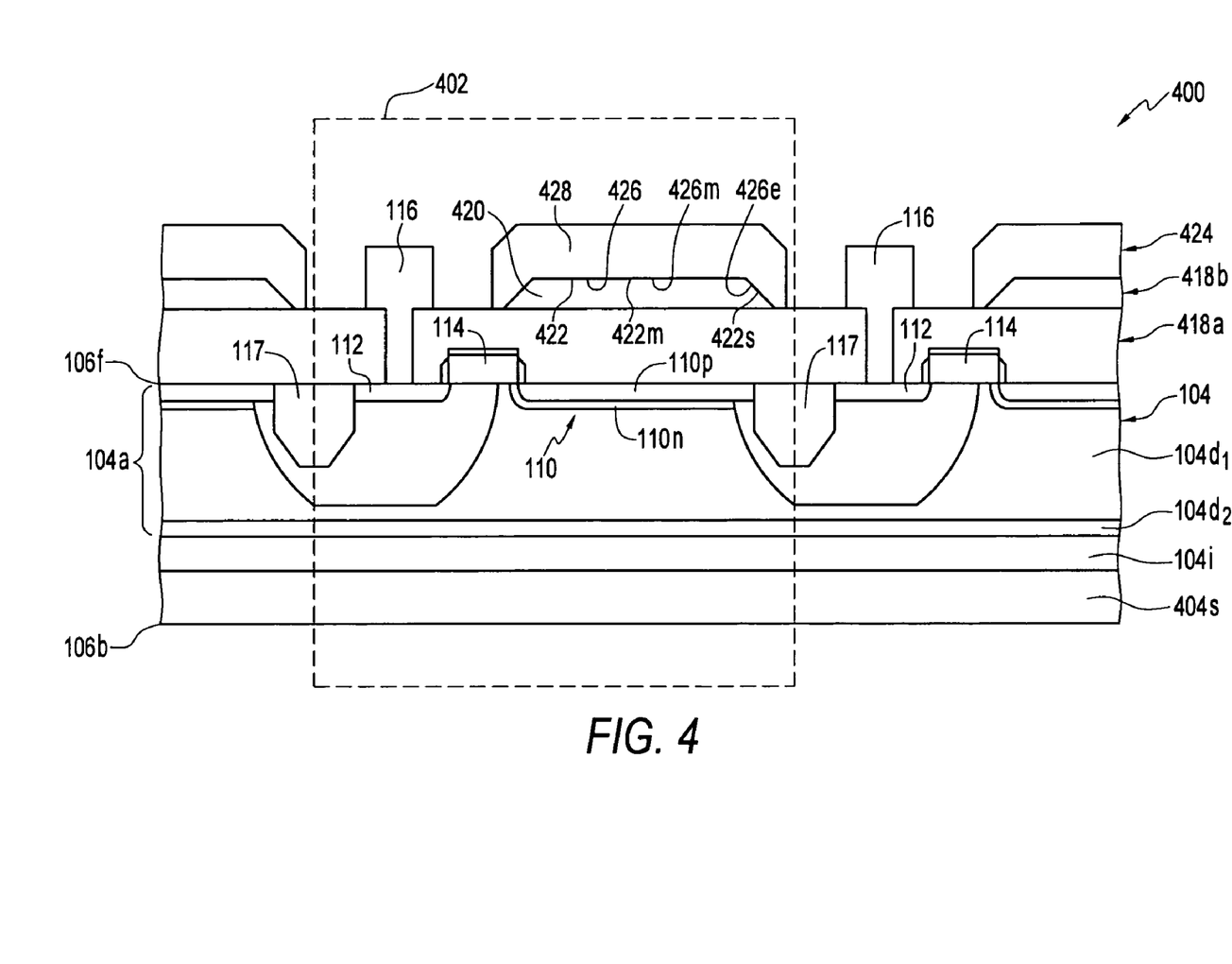
FIG. 4 illustrates a partial cross-sectional view of an image pixel array formed in accordance with a third embodiment disclosed herein.

Although FIG. 2C only illustrates curved photoresist precursors 146 as a result of a reflowing process, the photoresist precursors 144 can be formed into various other convex shapes to form the protruding portions 120 as shown in FIGS. 3 and 4. In one example, an etching process can be carried out to obtain shaped photoresist precursors 146 similar to the shape of protruding portions 120 shown in FIG. 4. Those skilled in the art will appreciate that various other methods can be used to form the variously shaped photoresist precursors 146.

Figure 2E:
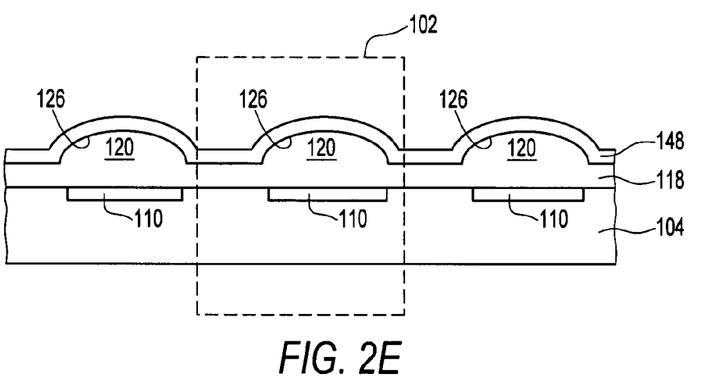

FIG. 2E shows a radiation reflecting metallic material 148 being formed over the protruding portions 120 by any of various methods, such as sputtering. The radiation reflecting metallic material 148 conforms to the convex surfaces 122 of the dielectric layer 118 and forms a plurality of non-planar surfaces 126, each of which corresponds to a photosensor 110 formed in the same pixel cell 102. As previously described, the non-planar surface 126 is capable of directing incident radiation reaching the non-planar surface 126 toward the corresponding photosensor 110 in the same pixel cell 102.

Figure 2F:
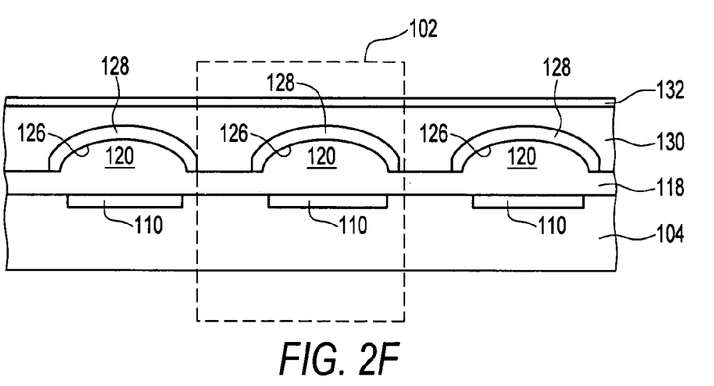

FIG. 2F shows a plurality of radiation reflectors 128 being formed in the radiation reflecting metallic material 148. For example, an etching process can be employed to selectively remove portions of the metallic material 148 between the adjacent radiation reflectors 128. Each radiation reflector 128 has a non-planar surface 126. As FIG. 2F also shows, additional semiconductor components, such as inter-metal dielectric layer 130 and a metallization layer 132, can be formed over the radiation reflectors 128. Those skilled in the art will appreciate that various other methods can also be used to form the radiation reflectors 128 as well as the additional semiconductor components.

FIG. 3 shows a second embodiment of an image pixel array 300 having a plurality of image pixel cells 302. In each pixel cell 302, the radiation reflector 328 on a metallic layer 324 is formed with a different shape than the concave shape shown in FIGS. 1A to 1C. In this embodiment, the non-planar surface 326 of each radiation reflector 328 can be formed to have a curved concave edge portion 326e, which joins to a substantially flat upper portion 326m. When off-axis incident radiation components pass a photosensor 110 and penetrate through the device substrate 104 to reach the curved edge portion 326e, it can reflect such off-axis radiation components back to the photosensor 110. Thus the curved edge portion 326e can further focus the reflected radiation toward the photosensor 110 in the same pixel cell 302. Accordingly, the non-planar surface 326 of each radiation reflector 328 is capable of directing substantially all radiation components reaching the curved edge portion 326e to the photosensor 110 located in the same image pixel cell 302.

The non-planar surface 326 of each radiation reflector 328 can be formed in a similar manner as the manner in which non-planar surface 126 (see, FIGS. 1A to 1C) is formed. For example, the dielectric layer 318, after being formed over the device substrate 104, can be selectively etched to form a plurality of protruding portions 320. Each protruding portion 320 can have a convex surface 322 comprising a substantially flat surface 322m and a curved side surface 322s. When the metallic layer 324 is formed over the dielectric layer 318, each protruding portion 320 can define a non-planar surface 326 on the radiation reflector 328. For example, the non-planar surface 326 can be formed to be complementary to the convex surface 322 on the protruding portion 320. Those skilled in the art will appreciate that various other methods can also be used to form the metallic layer 324 and the non-planar surfaces 326.

FIG. 4 shows a third embodiment of an image pixel array 400 including a plurality of image pixel cells 402. In each image pixel cell 402, the non-planar surface 426 of the radiation reflector 428 can be formed to comprise a beveled edge portion 426e, which joins to a substantially flat portion 426m.

When off-axis incident radiation components pass a photosensor 110 and penetrate through the device substrate 104 to reach the curved edge portion 426e, the curved edge portion 426e can reflect such off-axis radiation components back to the photosensor 110. The beveled edge portion 426e can thus further focus the reflected radiation toward the photosensor 110 in the same pixel cell 402. Accordingly, the non-planar surface 426 is capable of directing substantially all photons reaching such curved edge portion 426e toward the photosensitive region of the photosensor 110 in the same pixel cell 402.

In the embodiment shown in FIG. 4, a first dielectric layer 418a can be formed over the device substrate 104 at the frontside 106f, similar to the dielectric layers 118, 318 described above. A second dielectric layer 418b is then formed on the first dielectric layer 418a and is selectively etched to form each protruding portion 420 with a beveled side portion 422s. For example, the etching process is controlled so that the first dielectric layer 418a is substantially intact when forming the protruding portion 420. In one example, the first and second dielectric layers 418a, 418b can be formed of different materials so that the first dielectric layer 418a is more resistant to the etchant used in the etching process for the protruding portions 420.

As can be seen in the cross-sectional view of the image pixel cell 402 as shown in FIG. 4, the protruding portion 420 can have a trapezoid shape with a flat top portion 422m and sloped side portions 422s. The protruding portion 420 so formed can define the non-planar surface 426 of the metallic layer 424 to have a beveled edge portion 426e, when the metallic layer 424 is provided and formed over the protruding portion 420. The beveled edge portion 426e on each radiation reflector 428 can be formed in a similar manner as is the curved concave edge portion 326e (see, FIG. 3) and by controlling the selective etching process to form a straight edge. Those skilled in the art will appreciate that various other methods can also be used to form the metallic layer 424 and the non-planar surfaces 426.

The various image pixel arrays 100, 300, 400 and/or the imaging device 101 described above can have increased quantum efficiency and/or reduced optical crosstalk in comparison to conventional backside illuminated imaging devices. In the example shown in FIG. 1C, the radiation reflector 128 in each pixel cell 102 can reflect radiation components that escape a corresponding photosensor 110 or otherwise pass through the device substrate 104 in the same pixel cell 102 to reach the non-planar surface 126 of the radiation reflector 128. The non-planar surface 126 is capable of directing such escaped radiation components back to the corresponding photosensor 110 in the same pixel cell 102 so that the escaped radiation components can be captured by such corresponding photosensor 110. As substantially all escaped radiation components can be directed by the non-planar surface 126 back to the photosensor 110 in the same pixel cell 102, the non-planar surface 126 thus reduces potential crosstalk effect and increases quantum efficiency. Likewise, the non-planar surfaces 326, 426 for pixel arrays 300, 400 can increase quantum efficiency and reduce optical crosstalk.

Figure 5:
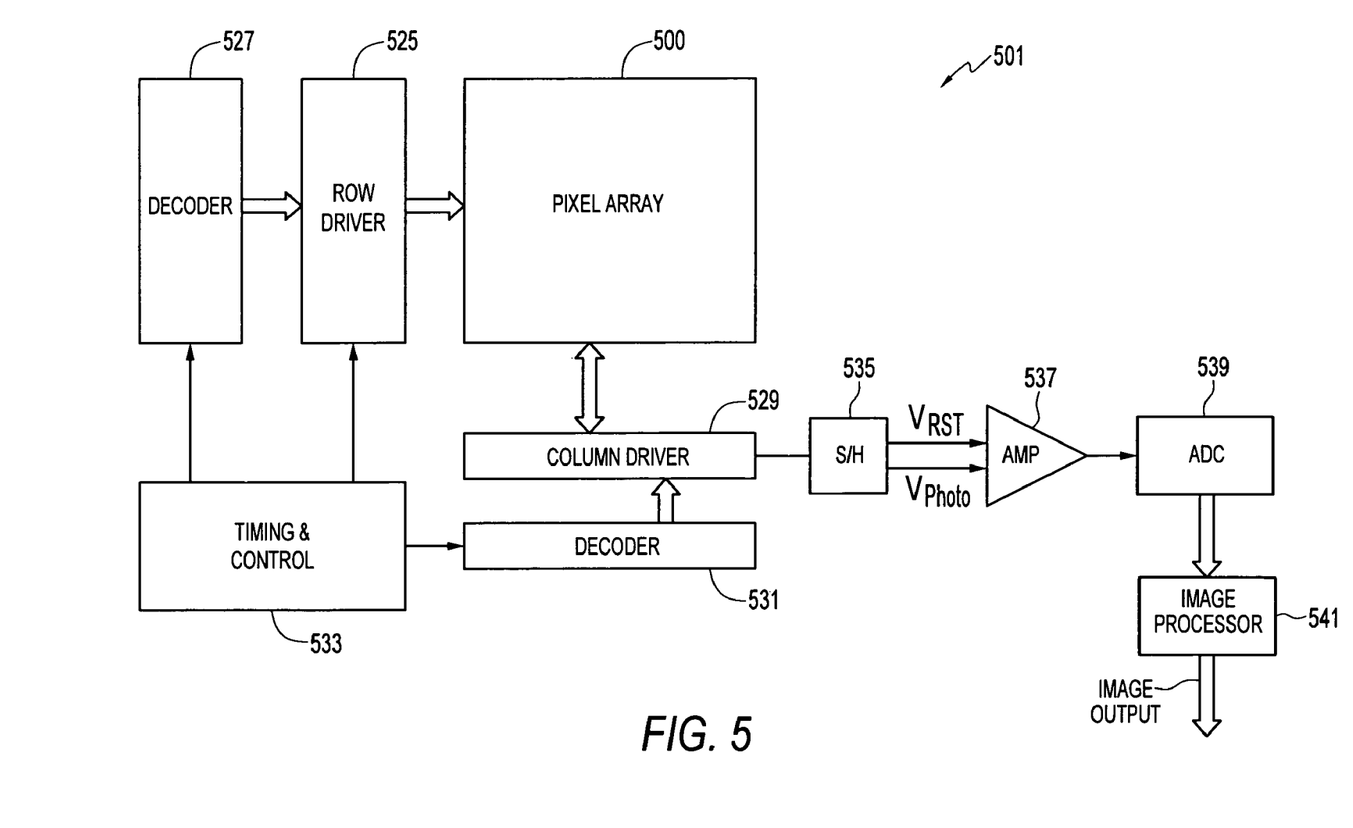
FIG. 5 is a block diagram of an imaging device constructed in accordance with one of the embodiments disclosed herein.

FIG. 5 is a block diagram showing the major electrical components of a CMOS imaging device 501, which contains a pixel array 500. The pixel array 500 can be formed to include any of the image pixel array embodiments 100, 300, 400 formed as described above. The pixel array 500 is formed with pixel cells arranged in a predetermined number of columns and rows. The pixel array 500 can capture incident radiation from an optical image and convert the captured radiation to electrical signals, such as analog signals.

The electrical signals obtained and generated by the pixel cells in the pixel array 500 can be read out row by row to provide image data of the captured optical image. For example, pixel cells in a row of the pixel array 500 are all selected for read-out at the same time by a row select line, and each pixel cell in a selected column of the row provides a signal representative of received light to a column output line. That is, each column also has a select line, and the pixel cells of each column are selectively read out onto output lines in response to the column select lines. The row select lines in the pixel array 500 are selectively activated by a row driver 525 in response to a row address decoder 527. The column select lines are selectively activated by a column driver 529 in response to a column address decoder 531.

The imaging device 501 can also comprise a timing and controlling circuit 533, which generates one or more read-out control signals to control the operation of the various components in the imaging device 501. For example, the timing and controlling circuit 533 can control the address decoders 527 and 531 in any of various conventional ways to select the appropriate row and column lines for pixel signal read-out.

The electrical signals output from the column output lines typically include a pixel reset signal ($V_{RST}$) and a pixel image signal ($V_{Photo}$) for each image pixel cell in a CMOS imaging device. In an example of an image pixel array 500 containing four-transistor CMOS image pixel cell, the pixel reset signal ($V_{RST}$) can be obtained from a floating diffusion region when it is reset by a reset signal RST applied to a corresponding reset transistor, while the pixel image signal ($V_{Photo}$) is obtained from the floating diffusion region when photo generated charge is transferred to the floating diffusion region. Both the $V_{RST}$ and $V_{Photo}$ signals can be read into a sample and hold circuit (S/H) 535. In one example, a differential signal ($V_{RST}$-$V_{Photo}$) can be produced by a differential amplifier (AMP) 537 for each pixel cell. Each pixel cell's differential signal can be digitized by an analog-to-digital converter (ADC) 539, which supplies digitized pixel data as the image data to an image processor 541, which processes the pixel signals from the pixel array 500 to produce an image. Those skilled in the art would appreciate that the imaging device 501 and its various components can be in various other forms and/or operate in various other ways. In addition, although the imaging device 501 illustrated is a CMOS imaging device, other types of solid state imaging devices, pixel arrays, and readout circuitries may also be used.

Figure 6:
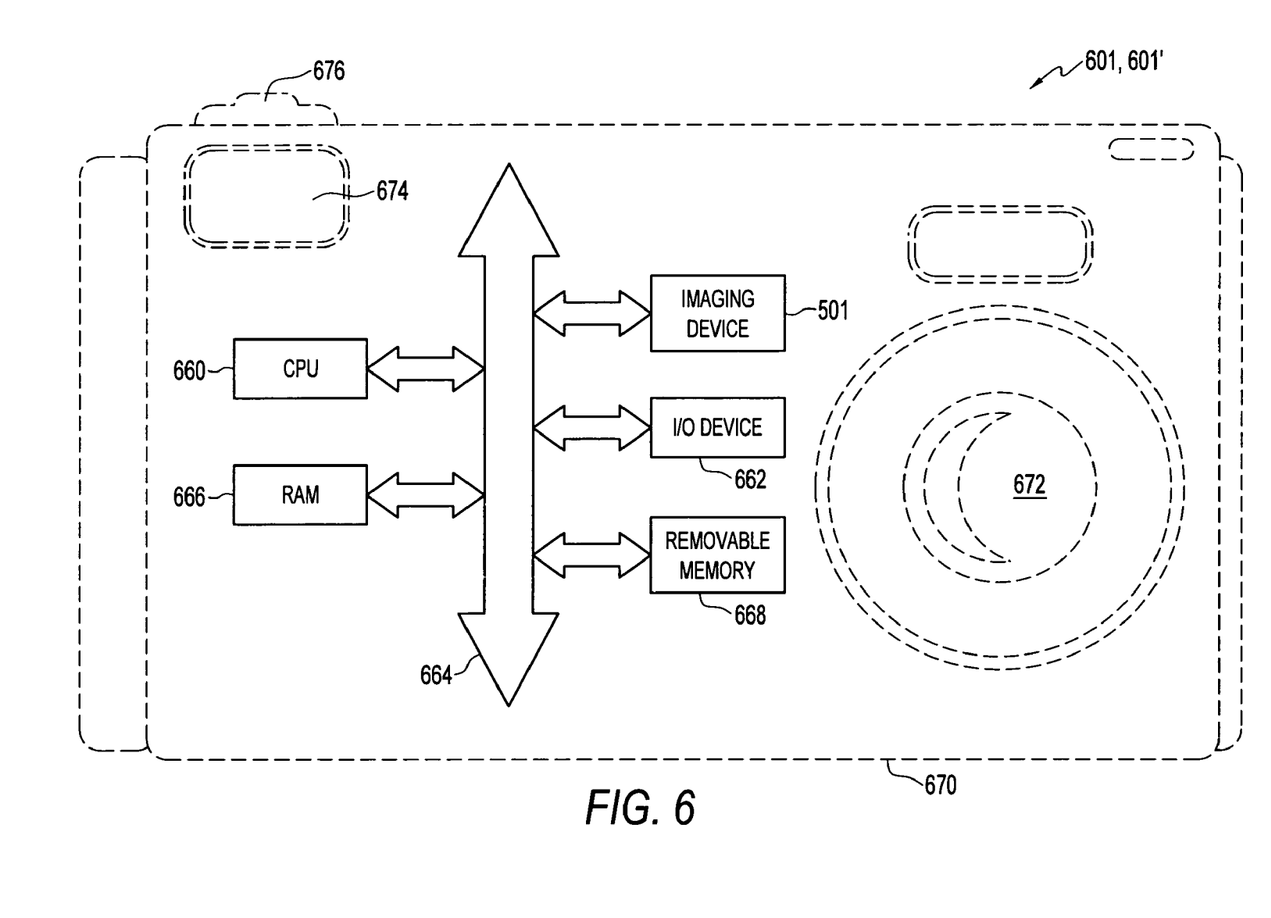
FIG. 6 is an illustration of an imaging system comprising the imaging device formed in accordance with one of the embodiments disclosed herein.

FIG. 6 illustrates a processing system 601 including an imaging device 501. The imaging device 501 may be combined with a processor, such as a CPU, digital signal processor, or microprocessor, with or without memory storage on a single integrated circuit or on a different chip than the processor. In the example as shown in FIG. 6, the processing system 601 can generally comprise a central processing unit (CPU) 660, such as a microprocessor, that communicates with an input/output (I/O) device 662 over a bus 664. The processing system 601 can also comprise random access memory (RAM) 666, and/or can include removable memory 668, such as flash memory, which can communicate with CPU 660 over the bus 664.

The processing system 601 can be any of various systems having digital circuits that could include the imaging device 501. Without being limiting, such a processing system 601 could include a computer system, a digital still or video camera illustrated by the dotted lines of FIG. 6, a scanner, a machine vision, a vehicle navigation, a video telephone system, a camera mobile telephone, a surveillance system, an auto focus system, a star tracker system, a motion detection system, an image stabilization system, and other systems supporting image acquisition. In the example shown in FIG. 6, the processing system 601 is employed in a digital still or video camera 601', which has a camera body portion 670, a camera lens 672, a view finder 674, and a shutter release button 676. When depressed, the shutter release button 676 operates the imaging device 501 so that light from an image passes through the camera lens 672. The incident light then impinges on and is captured by the pixel array 500 (see FIG. 5). As those skilled in the art will appreciate, the imaging device 501, the processing system 601, the camera system 601' and other various components contained therein can also be formed and/or operate in various other ways.

It is again noted that although the above embodiments are described with reference to a CMOS imaging device, they are not limited to CMOS imaging devices and can be used with other solid state imaging device technology (e.g., CCD technology) as well.

It will be appreciated that the various features described herein may be used singly or in any combination thereof. Therefore, the invention is not limited to the embodiments specifically described herein. While the foregoing description and drawings represent examples of embodiments, it will be understood that various additions, modifications, and substitutions may be made therein as defined in the accompanying claims. In particular, it will be clear to those skilled in the art that other specific forms, structures, arrangements, proportions, materials can be used without departing from the essential characteristics thereof. The presently disclosed embodiments are therefore to be considered in all respects as illustrative and not restrictive.

What is claimed as new and desired to be protected by Letters Patent of the United States is:

1. An image pixel cell comprising:
    a photosensor formed at a front side of a substrate and adapted to detect visible. radiation; and
    a radiation reflector positioned at a front side of the substrate and having a non-planar reflecting surface facing toward the photosensor and expanding laterally beyond the photosensor, the non-planar reflecting surface reflecting radiation components of the visible radiation, received through a backside of the substrate, to the photosensor,
    wherein the non-planar reflecting surface comprises a substantially flat middle portion and an edge portion, the edge portion being a curved concave surface.

2. The image pixel cell of claim 1, wherein the radiation reflector comprises a reflective metal coating.

3. The image pixel cell of claim 1, wherein the radiation reflector is a part of an interconnecting metal portion.

4. The image pixel cell of claim 1 further comprising a substantially transparent dielectric formed in contact with the radiation reflector, wherein the dielectric has a surface shape complementary to the non-planar surface of the radiation reflector.

5. The image pixel cell of claim 1 further comprising a color filter positioned at a backside of the substrate for passing a selected radiation component of the visible radiation.

6. The image pixel cell of claim 1, wherein the pixel cell is a CMOS pixel cell.

7. An image pixel cell in a backside illuminated imaging device, the image pixel cell comprising:
    a substrate having a first side and a second side;
    a metallic portion positioned at the first side of the substrate and comprising a non-planar surface facing toward the first side of the substrate; and
    a photosensor formed at the first side of the substrate for detecting incident radiation impinged on the second side of the substrate and reflected by the metallic portion,
    wherein the metallic portion expands laterally beyond the photosensor, and
    wherein the non-planar surface comprises a substantially flat middle portion and an edge portion, the edge portion being a curved concave surface.

8. The image pixel cell of claim 7, wherein the edge portion is capable of directing substantially all light components reaching such edge portion toward the photosensor.

9. A backside illuminated imaging device comprising:
    a substrate having a frontside and a backside;
    a plurality of photosensors formed in association with the substrate;
    a color filter array formed over the substrate at the backside and comprising a plurality of color filters for passing selected radiation components of incident radiation to the photosensors; and
    a plurality of radiation reflectors formed over the substrate at the frontside and each corresponding to a photosensor;
    wherein the radiation reflectors each expand laterally beyond the photosensor and have a non-planar surface capable of directing photons reaching the non-planar surface toward the corresponding photosensor, and
    wherein the non-planar surface comprises a substantially flat middle portion and an edge portion, the edge portion being a curved concave surface.

10. The imaging device of claim 9, wherein the color filter array causes the photosensors to detect red, green, and blue light.

11. The imaging device of claim 9, wherein the color filter array causes the photosensors to detect cyan, magenta, and yellow light.

12. The imaging device of claim 9, wherein the edge portion being capable of directing substantially all photons reaching the edge portion toward the photo sensor.

13. The imaging device of claim 9, wherein the imaging device is part of a camera.

14. A backside illuminated imaging system comprising:
    a substrate having a frontside and a backside;
    a plurality of photosensors formed in the substrate and arranged in an array;
    a metallic portion formed over the substrate at the frontside and having a plurality of radiation reflectors; and
    a readout circuit reading out signals from the photosensors,
    wherein the radiation reflectors each expand laterally beyond the photosensor and have a non-planar surface facing toward the frontside of the substrate and corresponding to a photosensor;
    wherein the non-planar surface comprises a substantially flat middle portion and an edge portion, the edge portion being a curved concave surface; and
    wherein each radiation reflector is capable of directing photons reaching the non-planar surface toward the corresponding photosensor.

15. The imaging system of claim 14 further comprising a dielectric formed over the substrate at the backside, wherein the dielectric comprises a plurality of protruding portions facing away from the substrate, and wherein the protruding portions each define the shape of a corresponding non-planar surface of a radiation reflector.

16. The imaging system of claim 14, wherein at least one of the non-planar surfaces comprises a concave shape.

17. The imaging system of claim 14, wherein the edge portion is capable of directing substantially all photons reaching the edge portion toward the corresponding photosensor.

18. The imaging system of claim 14 further comprising at least one interconnecting metal portion, wherein the interconnecting metal portion comprises a metallization pattern for interconnecting components of the imaging system.

19. The image system of claim 18, wherein the metallic portion forms at least a part of the interconnecting metal portion.

20. The image system of claim 18, wherein the metallic portion is formed without metallization patterns.

* * * * *